US008881087B2

(12) United States Patent
Herder et al.

(10) Patent No.: US 8,881,087 B2
(45) Date of Patent: Nov. 4, 2014

(54) POWER ROUTING WITH INTEGRATED DECOUPLING CAPACITANCE

(75) Inventors: Sjoerd Herder, Den Hoorn (NL); Harro Koning, Arnhem (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/876,303

(22) PCT Filed: Sep. 28, 2011

(86) PCT No.: PCT/EP2011/066831
§ 371 (c)(1),
(2), (4) Date: Mar. 27, 2013

(87) PCT Pub. No.: WO2012/041889
PCT Pub. Date: Apr. 5, 2012

(65) Prior Publication Data
US 2013/0181337 A1    Jul. 18, 2013

(30) Foreign Application Priority Data
Sep. 29, 2010 (EP) ..................................... 10182111

(51) Int. Cl.
G06F 17/50 (2006.01)
H01L 23/528 (2006.01)
H01L 21/768 (2006.01)
H01L 23/522 (2006.01)

(52) U.S. Cl.
CPC ....... *H01L 23/528* (2013.01); *H01L 2924/0002* (2013.01); *H01L 21/76877* (2013.01); *H01L 23/5286* (2013.01); *H01L 23/5223* (2013.01)
USPC .......................................................... 716/126

(58) Field of Classification Search
CPC ................................. G06F 17/30; G06F 17/50
USPC ....................................................... 716/126
See application file for complete search history.

(56) References Cited

U.S. PATENT DOCUMENTS 7,546,557 B2    6/2009 Kong
2007/0090401 A1*   4/2007 Baumann et al. ............. 257/203
(Continued)

FOREIGN PATENT DOCUMENTS

JP         6318597 A    11/1994

OTHER PUBLICATIONS

A. Tork et al. "Power Grid Automatic Metal Filling Algorithm Forming Maximum on-chip Decoupling Capacitance." IEEE, 2007, pp. 157-159.

*Primary Examiner* — Thuan Do
*Assistant Examiner* — Mohammed Alam
(74) *Attorney, Agent, or Firm* — Coats & Bennett, PLLC

(57) ABSTRACT

An integrated circuit chip is disclosed having a semiconductor substrate and a plurality of conduction layers (metalz, metalz+1), disposed on the semiconductor substrate and separated by dielectric layers, for distribution of power and electrical signals on the chip. The integrated circuit chip comprises a power-supply distribution network (200) which comprises, in a first one (metalz) of the conduction layers, a first mesh structure (210) of electrically conductive material for distribution of a first electrical potential (POWER) of the power supply. The power-supply distribution network also comprises, in a second one (metalz+1) of the conduction layers, different from the first one of the conduction layers, a second mesh structure (220) of electrically conductive material for distribution of a second electrical potential (GROUND) of the power supply. In the first one (metalz) of the conduction layers, a first plurality of islands (212) of electrically conductive material is provided, each island being located in a hole (214) of the first mesh structure (210) and being electrically insulated from the first mesh structure with a dielectric material.

12 Claims, 4 Drawing Sheets

(56) References Cited

U.S. PATENT DOCUMENTS

| | | |
|---|---|---|
| 2007/0094630 A1 | 4/2007 | Bhooshan |
| 2007/0187739 A1 | 8/2007 | Liu et al. |
| 2007/0187740 A1 | 8/2007 | Komura |
| 2008/0158776 A1 | 7/2008 | Chen et al. |
| 2011/0001249 A1* | 1/2011 | Law et al. .................... 257/776 |
| 2012/0304141 A1* | 11/2012 | Vogel et al. .................. 716/116 |

* cited by examiner

Producing a power supply network for an IC chip:
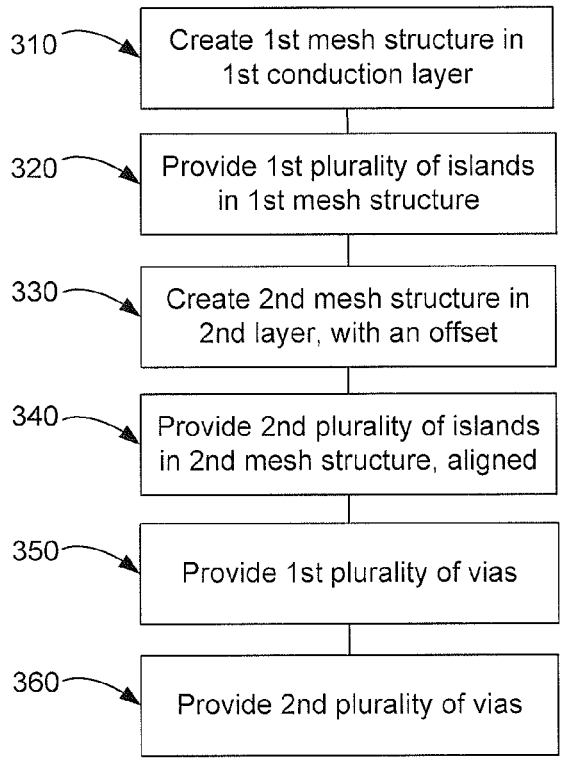
*Fig 3*
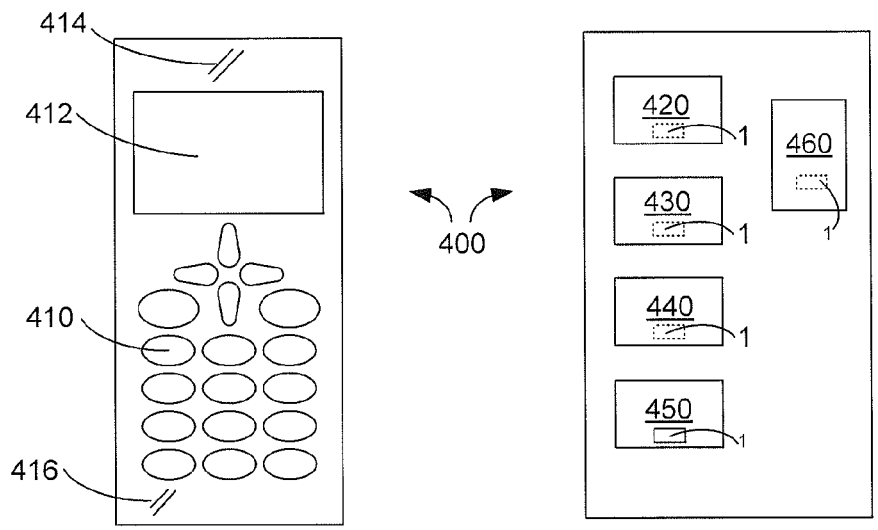
*Fig 4a*  *Fig 4b*

POWER ROUTING WITH INTEGRATED DECOUPLING CAPACITANCE

TECHNICAL FIELD

The present invention relates to integrated circuit design and manufacture. More particularly, the invention relates to an integrated circuit chip having a semiconductor substrate and a plurality of conduction layers, disposed on the semiconductor substrate and separated by dielectric layers, for distribution of power and electrical signals on the chip, wherein the integrated circuit chip comprises a power-supply distribution network. The invention also relates to a method in producing a power-supply distribution network for an integrated circuit chip, and to an electronic apparatus comprising such an integrated circuit chip.

BACKGROUND

Power routing in a large digital integrated circuit (IC), such as a large "sea of gates", is normally done by means of thick metal stripes (usually the two top layers in an IC creation process) from "north-to-south" and/or "west-to-east" over the entire digital area ("north-to-south" and "east-to-west" are used in this description to indicate a first direction and a second direction, respectively, which are essentially perpendicular to each other, and are thus not used to denote the normal geographical directions north-to-south and east-to-west, although they could coincide).

FIG. 1 shows an example of such power routing in the form of a power-supply distribution network 100. In one metal layer metalz, the current flows, for example, from north-to-south, in the other metal layer metalz+1 it flows from west-to-east. Just a small part is shown of the entire network which extends in all directions: north, south, west and east. By connecting both layers with each other by means of vias 130, a virtual mesh is created allowing the current to flow in many directions. As seen in FIG. 1, stripes 110, 120 and 110', 120' of ground and supply voltage are alternately routed in both metals layers metalz, metalz+1, respectively.

The present inventors have identified the following problems/drawbacks with a power routing of the type depicted in FIG. 1.

Firstly, it does not add decoupling capacitance to this two-layer power mesh directly. Therefore, in order to get stable digital circuitry, the power supply must be decoupled, which requires additional components.

Secondly, there is a risk of causing a relatively large amount of IR drop. As is well known per se, current through a wire causes a voltage drop, since a wire has a certain resistance, no matter how small. The voltage drop ($V_{drop}$) can be calculated using the formula $V_{drop}=I*R$, where I denotes the current and R denotes the resistance. Voltage drop in the power supply may introduce problems with the behavior of the circuitry being supplied by the power supply.

Thirdly, unwanted signals (EM noise, for instance) from the circuitry below or towards the circuitry below can pass through. Noise can cause delayed or false switching of the circuitry, resulting in unpredictable behavior. The supply voltage is normally routed in the top layer as well, which makes things even worse (since the supply voltage, or "POWER", is in many cases the aggressor).

Therefore, there is a need for improvements with respect to these problems.

SUMMARY

It is accordingly an object of the invention to eliminate or alleviate at least some of the problems referred to above.

One aspect of the present invention therefore is an integrated circuit chip having a semiconductor substrate and a plurality of conduction layers, disposed on the semiconductor substrate and separated by dielectric layers, for distribution of power and electrical signals on the chip, wherein the integrated circuit chip comprises a power-supply distribution network. The power-supply distribution network comprises, in a first one of the conduction layers, a first mesh structure of electrically conductive material for distribution of a first electrical potential of the power supply. The power-supply distribution network also comprises, in a second one of the conduction layers, different from the first one of the conduction layers, a second mesh structure of electrically conductive material for distribution of a second electrical potential of the power supply. In the first one of the conduction layers, a first plurality of islands of electrically conductive material is provided, each island being located in a hole of the first mesh structure and being electrically insulated from the first mesh structure with a dielectric material.

In one or more embodiments of the integrated circuit chip, the power-supply distribution network comprises, in the second one of the conduction layers, a second plurality of islands of electrically conductive material, each island being located in a hole of the second mesh structure and being electrically insulated from the second mesh structure with a dielectric material.

Moreover, in one or more embodiments of the integrated circuit chip, the power-supply distribution network comprises a first plurality of vias extending through a dielectric layer between the first one and the second one of the conduction layers and electrically connecting the first mesh structure with the second plurality of islands. Correspondingly, the power-supply distribution network may also comprise a second plurality of vias extending through the dielectric layer between the first one and the second one of the conduction layers and electrically connecting the second mesh structure with the first plurality of islands.

According to embodiments of the present invention, the first and second mesh structures may each have a regular and repetitive structure.

The electrically conductive material mentioned above may be metal, such as any metal commonly used for wiring and power distribution in integrated circuits. The conduction layers are, in the following, referred to as metal layers, and the conductive material is, in the following, referred to as metal, although other electrically conductive materials can be used as well. There are no particular constraints as to the conductivity or material choice of the electrically conductive material and the conduction layers, except that they shall have electrically conductive properties.

The dielectric material mentioned above may for instance be any dielectric material commonly used for insulation of metal layers in integrated circuits, such as silicon dioxide. Other dielectric materials are however also possible.

The first and second electrical potential of the power supply may e.g. be a supply voltage, or power, (usually referred to as "$V_{DD}$" or with a similar notation), and ground, respectively (or vice versa). However, other electrical potentials may also be efficiently decoupled in embodiments of the present invention.

In one embodiment of the integrated circuit chip, the second one of the conduction layers is disposed further away from the semiconductor substrate than the first one of the conduction layers, and the second electrical potential distributed by the second mesh structure is ground. The second mesh structure thereby acts as a shielding layer.

Advantages of the various features of the first aspect of the invention are identified in the detailed description section of this document.

A second aspect of the invention is an electronic apparatus comprising an integrated circuit chip according to the first aspect as referred to above. In one embodiment, the electronic apparatus is a mobile terminal adapted for use with one or more mobile communication networks compliant with, for instance, any of the standards or specifications selected from the group consisting of GSM, UMTS, LTE, W-CDMA, D-AMPS, CDMA2000, FOMA or TD-SCDMA.

A third aspect of the invention is a method in producing a power-supply distribution network for an integrated circuit chip having a semiconductor substrate and a plurality of conduction layers, disposed on the semiconductor substrate and separated by dielectric layers, for distribution of power and electrical signals on the chip. The method comprises the steps of:

creating, as a first conduction layer, a first mesh structure of electrically conductive material for distribution of a first electrical potential of the power supply;

providing a first plurality of islands of electrically conductive material in holes of the first mesh structure, said first plurality of islands being electrically insulated from the first mesh structure with a dielectric material;

creating, as a second conduction layer, a second mesh structure of electrically conductive material for distribution of a second electrical potential of the power supply, the second mesh structure being provided at an offset with respect to the first mesh structure, such that portions of the second mesh structure are aligned with said first plurality of islands of electrically conductive material in said holes of the first mesh structure;

providing a second plurality of islands of electrically conductive material in holes of the second mesh structure, said second plurality of islands being electrically insulated from the second mesh structure with a dielectric material and being aligned with portions of the first mesh structure;

providing a first plurality of vias extending between the first one and the second one of the conduction layers and electrically connecting said portions of the first mesh structure with said second plurality of islands; and providing a second plurality of vias extending between the first one and the second one of the conduction layers and electrically connecting said portions of the second mesh structure with said first plurality of islands.

The elements involved in the method according to the third aspect of the invention may be the same as or directly corresponding to the elements recited above for the first aspect of the invention.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Objects, features and advantages of embodiments of the invention will appear from the following detailed description, reference being made to the accompanying drawings.

FIG. 3 is a flowchart diagram illustrating a method in producing a power-supply distribution network for an integrated circuit chip.

FIG. 4a is a schematic front view of an electronic apparatus in the form of a mobile terminal.

FIG. 4b is a schematic block diagram of typical electronic components of the mobile terminal in FIG. 4a.

DETAILED DESCRIPTION

Figure 1:
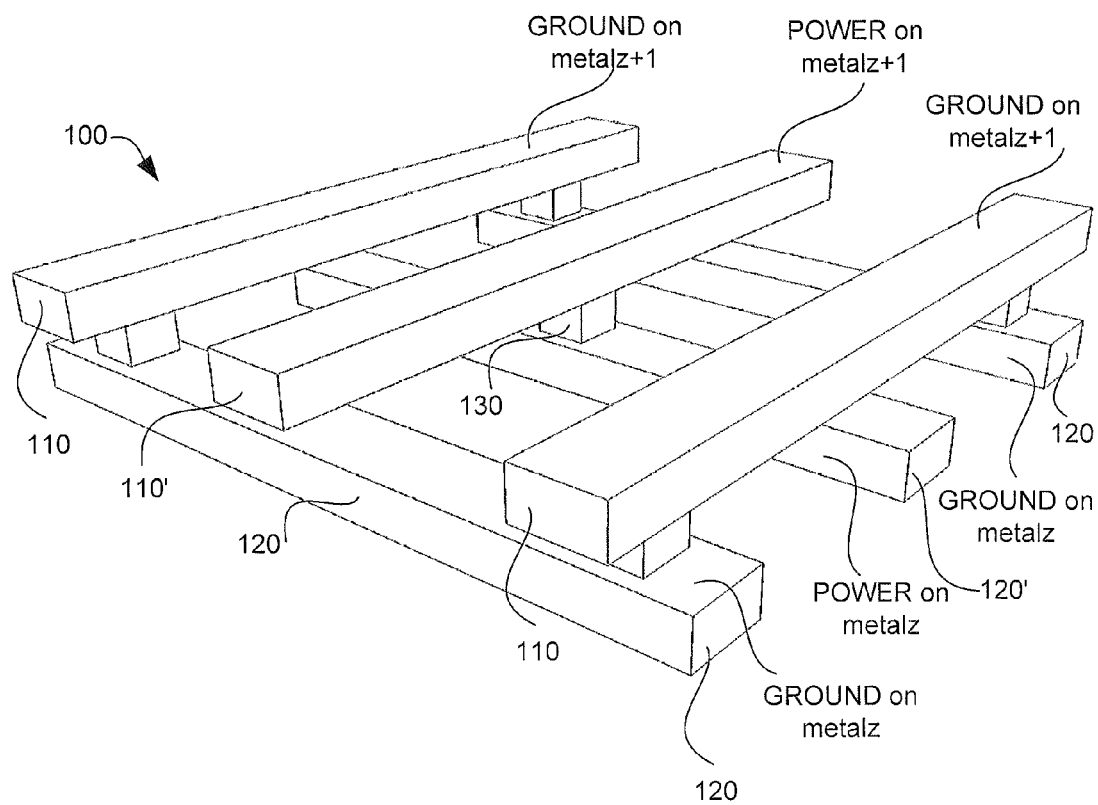
FIG. 1 is a 3D representation of an existing implementation of a power-supply distribution network.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

Figure 2A:
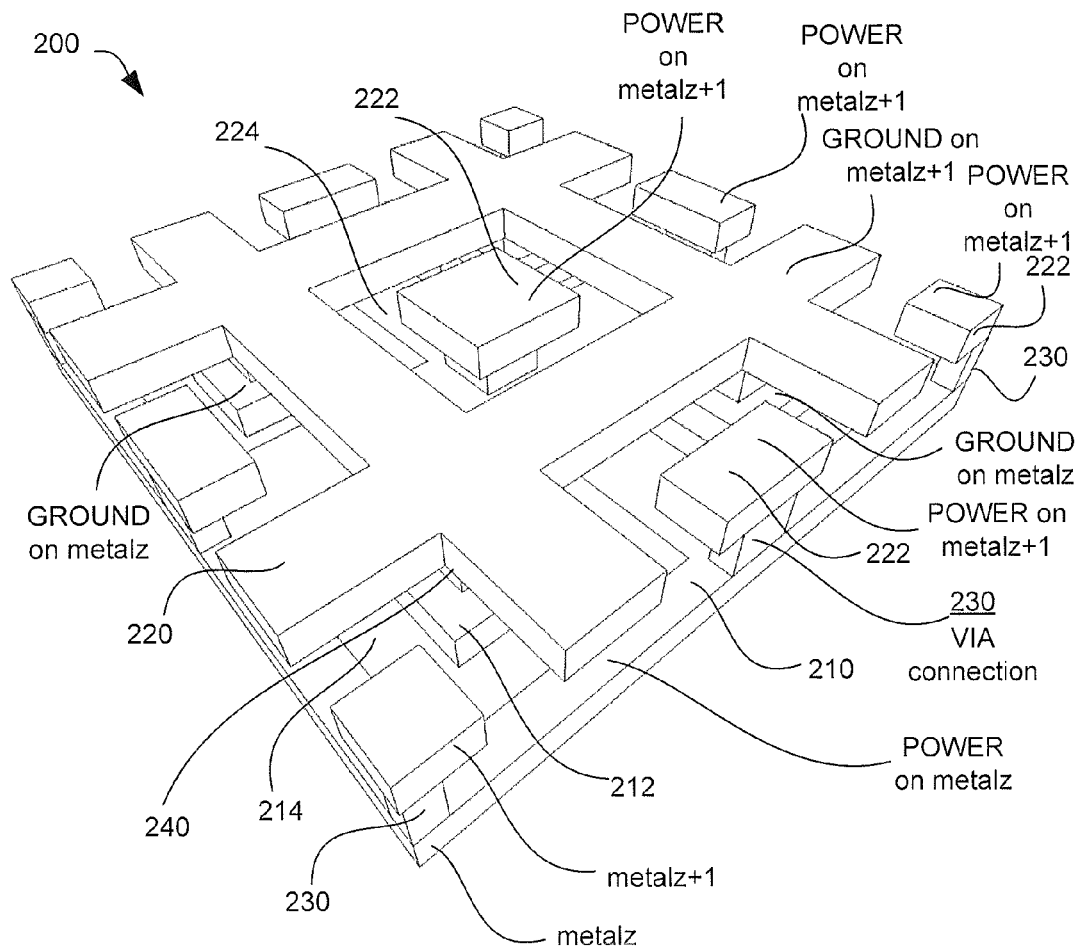
FIGS. 2a and 2b show a top and bottom view, respectively, of a power-supply distribution network according to an embodiment of the present invention.
Figure 2B:
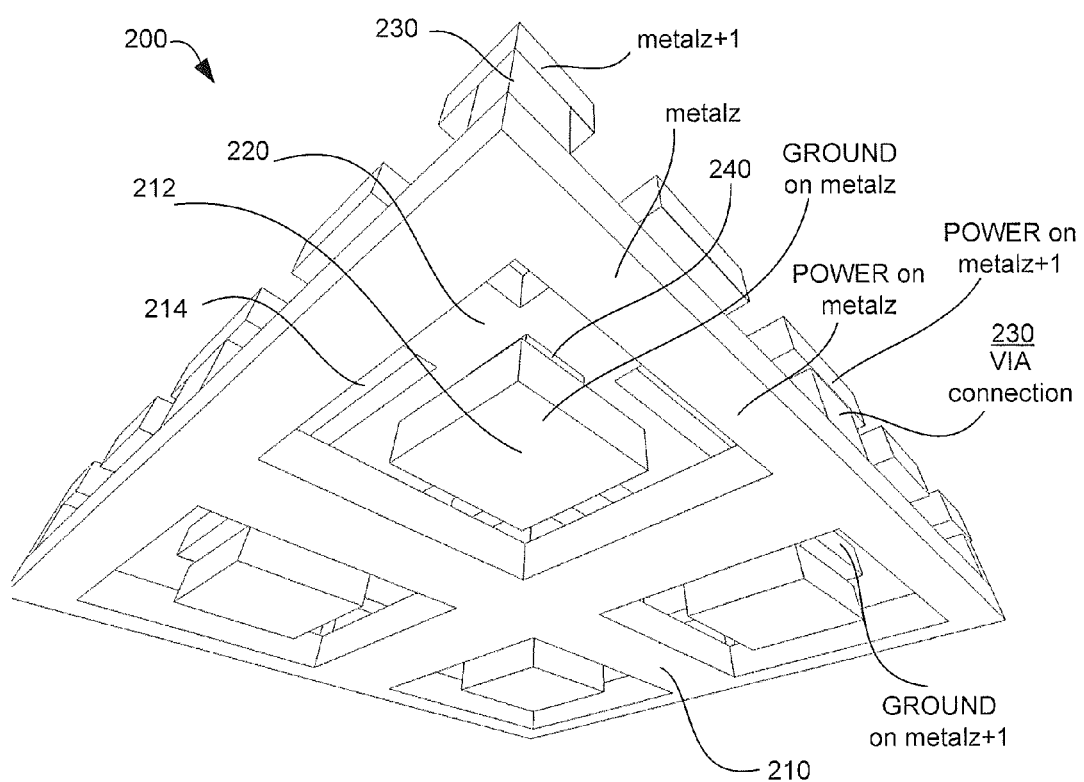

A power-supply distribution network 200 according to an embodiment of the present invention is shown in FIGS. 2a and 2b in a top and bottom view, respectively. In contrast to the existing design shown in FIG. 1, the power-supply distribution network 200 essentially uses one conduction layer, metalz, for the supply voltage routing (or "power routing" or "$V_{DD}$ routing"), and another conduction layer, metalz+1, for ground routing. The conduction layers metalz and metalz+1 are made of metal in the disclosed embodiment. Hence, the power-supply distribution network 200 comprises a first mesh structure 210 of electrically conductive material (in this case metal) in the first conduction layer metalz for distribution of a first electrical potential, POWER, of the power supply, and a second mesh structure 220 of electrically conductive material (in this case metal) in the second conduction layer metalz+1 for distribution of a second electrical potential, GROUND, of the power supply.

The ground routing may, in some embodiments, be done in the top metal-layer metalz+1 (i.e. the layer furthest away from the semiconductor substrate), thereby shielding the sensitive/aggressor supply-voltage network.

In the first conduction layer metalz, a first plurality of islands 212 of electrically conductive material is provided. Each island 212 is located in a hole 214 of the first mesh structure 210 and is electrically insulated from the first mesh structure with a dielectric material. Correspondingly, in the second conduction layer metalz+1, a second plurality of islands 222 of electrically conductive material is provided. Each island 222 is located in a hole 224 of the second mesh structure 220 and is electrically insulated from the second mesh structure with a dielectric material.

By letting the mesh structure 210, 220 form rings around small patches or islands 212, 222 of the same metal layer, a relatively large capacitance value can be reached. By carefully selecting the geometrical dimensions of and the spaces between the various metal components of the power-supply distribution network, the end-result is a relatively dense mesh (which is advantageous for conducting current), with a relatively high internal capacitance value.

According to an embodiment of the present invention, a layout of the power-supply distribution network can be accomplished using the following work flow. Reference is also made to FIG. 3 which illustrates a method in producing a power-supply distribution network for an integrated circuit chip.

1. Create a first mesh structure 210 with relatively large holes 214 (FIG. 3, step 310).
2. Put islands 212 inside the holes 214 (FIG. 3, step 320).
3. Apply this (points 1 and 2) to the bottom metal layer metalz (i.e. the one of the two metal layers (or first and second conduction layers) involved in the power-supply distribution network 200 which is closest to the semiconductor substrate).
4. Apply this (points 1 and 2) to the top metal layer metalz+1 (i.e. the one of the two metal layers (or first and second conduction layers) involved in the power-supply distribution network which is furthest away from the semiconductor substrate) as well, but now with an offset—for instance, both 50% to the north/south and west/east (wherein the islands will end up above or below a cross in the mesh structure of the other layer). Thus, a second mesh structure 220 with relatively large holes 224 is created, having islands 222 inside the holes 224 and being offset with respect to the first mesh structure 210 (FIG. 3, steps 330-340).
5. Put between each overlap of the two layers metalz, metalz+1 (i.e. between each island in one layer and the mesh structure in the other layer) a via 230 and 240, respectively (FIG. 3, steps 350-360). The vias 230 and 240 therefore act as connections from one metal layer to the other.

The end result is shown in FIG. 2a (top view) and FIG. 2b (bottom view). In these drawings, the islands 212/222 and holes 214/224 are rectangular. However, other shapes are possible as well. Just a small part (one complete top metal ring and four bottom metal rings) is shown in FIGS. 2a and 2b of the entire power-supply distribution network 200 (extends in all directions: north, south, west and east).

It is to be noticed that the steps of the method shown in FIG. 3 can be performed in another order than disclosed. For instance, it may be practical to provide the vias 230/240 in steps 350/360 prior to creating the second mesh structure 220.

Since the inventive power-supply distribution network allows for a denser metal coverage than those of the type depicted in FIG. 1, a lower IR drop is facilitated.

Furthermore, an increased internal decoupling capacitance between the two mesh structures can be obtained, since the islands of metal in the holes create a larger parasitic capacitance.

Moreover, a relatively efficient shielding of the circuitry below the power routing from unwanted signals originating from other parts of the design is obtainable, since the relatively dense mesh in two metal layers acts as near-perfect shield, in particular if the top layer is ground. Also, for the same reason, a relatively efficient shielding of the circuitry below the power routing from unwanted signals originating from the circuitry itself towards other parts of the design is also obtainable.

Additionally, an improved reliability of processing is obtainable, since metal is used in a more homogeneous and repetitive pattern.

An embodiment of the power-supply distribution network 200 according to the present invention has been implemented (referred to below as "new implementation") and compared with an implementation of the power-supply distribution network 100 of the type depicted in FIG. 1 (referred to below as "existing implementation") in a 45 nm CMOS manufacturing process. The following parameters were used:

Existing implementation:
  Metalz=metal layer 6=M6
  Metalz+1=metal layer 7=M7
  Spacing M6=0.74 μm
  Spacing M7=1.5 μm
  Width M6=0.52 μm
  Width M7=1 μm New implementation:
  Metalz=metal layer 6=M6
  Metalz+1=metal layer 7=M7
  Spacing M6=spacing M7=0.45 μm
  Track width M6=track width M7=0.86 μm (i.e. width of "wires" in the mesh)
  Patch size M6=patch size M7=0.76×0.76 μm (i.e. dimensions of islands)

Using the above parameters, a layout of 100 μm×100 μm has been created. A parasitic extraction flow has been used to generate the table below from the layout.

| Specification | Existing implementation | New implementation | Unit | Difference |
| --- | --- | --- | --- | --- |
| Decoupling capacitance Total area | 0.997 | 1.67 | pF | +68% |
| Resistance Diagonal from top-left to bottom-right | 853 | 371 | mΩ | −59% |

FIGS. 4a and 4b show an exemplary electronic apparatus in the form of a mobile terminal 400, in which an integrated circuit chip 1 according to the present invention may be used. As shown, the mobile terminal 400 may include control buttons or keys 410, a display 412, a speaker 414 and a microphone 416. It should be understood that the mobile terminal 400 is surrounded by a housing, not specially shown, which may protect the mobile terminal 400 from wear and external influence. The housing is designed to hold various elements of the mobile terminal, including the aforementioned elements 410-416, as is well known by a person skilled in the art.

FIG. 4b is a schematic block diagram of the typical electronic components of the mobile terminal 400 in FIG. 4a. Thus, the mobile terminal 400 may include input means 420, output means 430, signal processing means 440, control circuitry 450 and memory means 460. The mobile terminal 400 may be configured in a number of different ways and include other or different elements, as is well known by a person in the art, such as modulators, demodulators, encoders, decoders etc. for processing data.

The input means 420 may include devices that a user uses in order to input information into the mobile terminal 400, such as the microphone 416, the display 412 and keys 410, etc.

The output means 430 may include devices that output information from the mobile terminal 400, including the display 412, the speaker 414, etc.

The signal processing means 440 may include various signal processing and filter elements, such as local oscillators, mixers, amplifiers, filters, etc.

The control circuitry 450 may include one or more central processing units (CPU:s), digital signal processors (DSP:s), microprocessors, application specific integrated circuits (ASIC:s), or the like. The control circuitry 450 may execute software instructions/programs or data structures in order to control the operation of the mobile terminal 400. It is also possible to use the control circuitry 450 to implement the signal processing means 440.

The memory means 460 may be implemented as a dynamic storage device, a static storage device, a flash memory etc. The memory means 460 may be used to store information and/or instructions for execution by the control circuitry 450, temporary variables or intermediate information during execution of instructions by the control circuitry 450, etc.

As is seen in FIG. 4*b*, one or more of the electronic components 420-460 may comprise one or more integrated circuit chips 1, containing a power-supply distribution network 200 according to the present invention.

The invention claimed is:

1. An integrated circuit chip comprising:
   a semiconductor substrate;
   a plurality of conduction layers disposed on the semiconductor substrate and separated by dielectric layers, said plurality of conduction layers configured for distribution of power and electrical signals on the chip; and
   a power-supply distribution network comprising:
      in a first one of the conduction layers, a first mesh structure of electrically conductive material for distribution of a first electrical potential of the power supply;
      in a second one of the conduction layers different from the first one of the conduction layers, a second mesh structure of electrically conductive material for distribution of a second electrical potential of the power supply; and
      in the first one of the conduction layers, a first plurality of islands of electrically conductive material, each of the first plurality of islands being located in a hole of the first mesh structure and being electrically insulated from the first mesh structure with a dielectric material.

2. The integrated circuit chip according to claim 1, wherein the power-supply distribution network comprises, in the second one of the conduction layers, a second plurality of islands of electrically conductive material, each of the second plurality of islands being located in a hole of the second mesh structure and being electrically insulated from the second mesh structure with a dielectric material.

3. The integrated circuit chip according to claim 2, wherein the power-supply distribution network comprises a first plurality of vias extending through a dielectric layer between the first one of the conduction layers and the second one of the conduction layers and electrically connecting the first mesh structure with the second plurality of islands.

4. The integrated circuit chip according to claim 3, wherein the power-supply distribution network comprises a second plurality of vias extending through the dielectric layer between the first one of the conduction layers and the second one of the conduction layers and electrically connecting the second mesh structure with the first plurality of islands.

5. The integrated circuit chip according to claim 1, wherein the first and second mesh structures each comprise a regular and repetitive structure.

6. The integrated circuit chip according to claim 1, wherein the first electrical potential of the power supply comprises one of a supply voltage and ground, and wherein the second electrical potential of the power supply comprises the other of the supply voltage and ground.

7. The integrated circuit chip according to claim 6, wherein the second one of the conduction layers is disposed further away from the semiconductor substrate than the first one of the conduction layers, wherein the second electrical potential distributed by the second mesh structure comprises ground, and wherein the second mesh structure thereby acts as a shielding layer.

8. The integrated circuit chip according to claim 1, wherein the electrically conductive material comprises metal.

9. The integrated circuit chip according to claim 1, wherein the dielectric material comprises silicon dioxide.

10. An electronic apparatus comprising an integrated circuit chip comprising:
    a semiconductor substrate;
    a plurality of conduction layers disposed on the semiconductor substrate and separated by dielectric layers, said plurality of conduction layers configured for distribution of power and electrical signals on the chip; and
    a power-supply distribution network comprising:
       in a first one of the conduction layers, a first mesh structure of electrically conductive material for distribution of a first electrical potential of the power supply;
       in a second one of the conduction layers different from the first one of the conduction layers, a second mesh structure of electrically conductive material for distribution of a second electrical potential of the power supply; and
       in the first one of the conduction layers, a first plurality of islands of electrically conductive material, each of the first plurality of islands being located in a hole of the first mesh structure and being electrically insulated from the first mesh structure with a dielectric material.

11. The electronic apparatus according to claim 10, wherein the electronic apparatus comprises a mobile terminal.

12. A method of producing a power-supply distribution network for an integrated circuit chip having a semiconductor substrate and a plurality of conduction layers disposed on the semiconductor substrate and separated by dielectric layers, said plurality of conduction layers configured for distribution of power and electrical signals on the chip, the method comprising:
    creating by a computer, as a first conduction layer, a first mesh structure of electrically conductive material for distribution of a first electrical potential of the power supply;
    providing a first plurality of islands of electrically conductive material in holes of the first mesh structure, said first plurality of islands being electrically insulated from the first mesh structure with a dielectric material;
    creating, as a second conduction layer, a second mesh structure of electrically conductive material for distribution of a second electrical potential of the power supply, the second mesh structure being provided at an offset with respect to the first mesh structure such that portions of the second mesh structure are aligned with said first plurality of islands of electrically conductive material in said holes of the first mesh structure;
    providing a second plurality of islands of electrically conductive material in holes of the second mesh structure, said second plurality of islands being electrically insulated from the second mesh structure with a dielectric material and being aligned with portions of the first mesh structure;
    providing a first plurality of vias extending between the first one of the conduction layers and the second one of the conduction layers and electrically connecting said portions of the first mesh structure with said second plurality of islands; and
    providing a second plurality of vias extending between the first one of the conduction layers and the second one of the conduction layers and electrically connecting said portions of the second mesh structure with said first plurality of islands.

* * * * *